(12) United States Patent
Ladd et al.

(10) Patent No.: US 10,387,792 B1
(45) Date of Patent: Aug. 20, 2019

(54) ETCHED SPIN-QUBIT FOR HIGH TEMPERATURE OPERATION

(71) Applicant: HRL Laboratories, LLC, Malibu, CA (US)

(72) Inventors: Thaddeus D. Ladd, Woodland Hills, CA (US); Andrey A. Kiselev, Agoura Hills, CA (US); Danny M. Kim, Agoura Hills, CA (US); Rongming Chu, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 117 days.

(21) Appl. No.: 15/638,254

(22) Filed: Jun. 29, 2017

(51) Int. Cl.
*H01L 29/12* (2006.01)
*G06N 10/00* (2019.01)
*H01L 29/04* (2006.01)
*H01L 29/205* (2006.01)
*B82Y 10/00* (2011.01)

(52) U.S. Cl.
CPC ........... *G06N 10/00* (2019.01); *H01L 29/045* (2013.01); *H01L 29/122* (2013.01); *H01L 29/205* (2013.01); *B82Y 10/00* (2013.01)

(58) Field of Classification Search
CPC ..... H01L 29/122; H01L 29/205; H01L 33/04; H01L 49/006
See application file for complete search history.

(56) References Cited

U.S. PATENT DOCUMENTS

2015/0214497 A1* 7/2015 Park .................. H01L 51/0591
257/4

OTHER PUBLICATIONS

"Room-Temperature Quantum Bit Storage Exceeding 39 Minutes Using Ionized Donors in Silicon-28", Saeedi, Kamyar et al., Science vol. 342 (6160), pp. 330-333, Nov. 15, 2013.
"Quantum Register Based on Individual Electronic and Nuclear Spin Qubits in Diamond," M. V. G. Dutt et al., Science vol. 316 (5829), pp. 1312-1316, Jun. 1, 2007.

(Continued)

*Primary Examiner* — Hoai V Pham
(74) *Attorney, Agent, or Firm* — Ladas & Parry

(57) ABSTRACT

A device for storing and/or transferring quantum data. The device has a plurality of elongate semiconductor structures arranged in side by said with each elongate semiconductor structure having a quantum well layer of one semiconductor material disposed between upper and lower layers of a different semiconductor material which share the same or essentially the same crystalline structure as that of the quantum well layer. Neighboring ones of the elongate semiconductor structures share a region forming a constriction between the neighboring ones of the elongate semiconductor structures. Also disclosed is a a method of adjusting exchange coupling between laterally coupled quantum wells in a quantum device having sidewalls, the method including: defining the sidewalls by etching a crystalline structure along lattice planes of said crystalline structure, the crystalline structure, after the sidewalls are etched, having a corrugated shaped with protuberances and grooves on opposing major surfaces thereof, and controlling a ratio of the distances (i) between opposing grooves on the opposing major surfaces of the crystalline structure and (ii) between opposing protuberances on the opposing major surfaces of the crystalline structure.

20 Claims, 6 Drawing Sheets

(56) References Cited

OTHER PUBLICATIONS

"Room temperature coherent control of defect spin qubits in silicon carbide," W. F. Koehl et al., Nature vol. 479, pp. 84-87, Nov. 3, 2011.
"Spins in few-electron quantum dots," R. Hanson et al., *Reviews of Modern Physics,* vol. 79, 1217, Oct.-Dec. 2007.
"Charge-Tunable Indium Gallium Nitride Quantum Dots," Zhang et al., Physical Review B 93(8), 085301 (2016).
"Zeeman Energy and Spin Relaxation in a One-Electron Quantum Dot", R. Hanson, Physical Review Letters, vol. 91, No. 19, 196802, Nov. 7, 2003.
J. R. Petta, et al. "Coherent Manipulation of Coupled Electron Spins in Semiconductor Quantum Dots", Science, vol. 309, pp. 2180-2184, Sep. 30, 2005.
"Dephasing time of GaAs electron-spin qubits coupled to a nuclear bath exceeding 200 µs", H. Bluhm, et al., Nature Physics, vol. 7, 109, Nov. 2011.
"Demonstration of Entanglement of Electrostatically Coupled Singlet-Triplet Qubits", M. D. Shulman, et al., Science vol. 336, 202, Apr. 13, 2012.
"Suppressing qubit dephasing using real-time Hamiltonian estimation", M. D. Shulman, et al., Nature Communications 5, 5156, Oct. 8, 2014.
"Coherent singlet-triplet oscillations in a silicon-based double quantum dot", B. M. Maune, et al. (HRL) Nature, vol. 481, pp. 344-347, Jan. 19, 2012.
"Isotopically enhanced triple-quantum-dot qubit", K. Eng, et al. (HRL) Science Advances 1, e1500214, May 29, 2015.
"A two-qubit logic gate in silicon", M. Veldhorst, et al. Nature, vol. 526, pp. 410-414, Oct. 15, 2015.
"Room-temperature entanglement between single defect spins in diamond", F. Dolde, et al., Nature Phys. 9, 139, Mar. 2013.
"Persistent Narrowing of Nuclear-Spin Fluctuations in InAs Quantum Dots Using Laser Excitation", B. Sun, et al. Physics Review Letters, 108, 187401, May 4, 2012.
"Single site-controlled in(Ga)As/GaAs quantum dots: growth, properties and device integration", C. Schneider, et al. Nanotechnology 20, 434012, Oct. 2, 2009.
"Optically Loaded Semiconductor Quantum Memory Register", D. Kim, et al., Physical Review Applied, vol. 5, 024014, Feb. 29, 2016.
"Single photon emission from site-controlled InGaN/GaN quantum dots", L. Zhang, et al. Appl. Phys. Lett. 103, 192114, 2013.
"Charge-tunable indium gallium nitride quantum dots", L. Zhang, et al. Physical Review, B 93, 085301, 2016.
"Complete quantum control of a single quantum dot spin using ultrafast optical pulses", D. Press, T. D. Ladd, B. Zhang, and Y. Yamamoto, Nature, vol. 456, pp. 218-221, Nov. 13, 2008.
"Isotopically enhanced triple-quantum-dot qubit", K. Eng, et al., Science Advances 1, e1500214, May 29, 2015.
"Steady-state and time-resolved photoluminescence from relaxed and strained GaN nanowires grown by catalyst-free molecular-beam epitaxy", J. B. Schlager, et al., Journal of Applied Physics, 103, 124309, Jun. 24, 2008.
"Quantum Dot Made in Metal Oxide Silicon-Nanowire Field Effect Transistor Working at Room Temperature", Lavieville, et al., Nano Letters, 15, pp. 2958-2964, Apr. 29, 2015.
"A CMOS silicon spin qubit", R. Maurand, et al., Nature Communications, 7, 13575, Nov. 24, 2016.
"Gate-Sensing Coherent Charge Oscillations in a Silicon Field-Effect Transistor", M. Fernando Gonzalez-Zalba, Nano Letters 16, pp. 1614-1619, Feb. 11, 2016.
"Spin coherence and dephasing in GaN", B. Beschoten, et al. Physical Review B, vol. 63, 121202, Mar. 13, 2001.
"Temperature dependence of electron spin relaxation in bulk GaN", J. H. Buβ, et al. Physical Review B 81, vol. 155216, Apr. 30, 2010.
"Spin Relaxation in InGaN Quantum Disks in GaN Nanowires", A. Banerjee, et al., Nano Letters 11, pp. 5396-5400, Nov. 3, 2011.
"Spin-flip transitions between Zeeman sublevels in semiconductor quantum dots", A. V. Khaetskii and Y. V. Nazarov, Physical Review B, vol. 64, 125316, Sep. 10, 2001.
"Carrier dynamics in site- and structure-controlled InGaN/GaN quantum dots", L. Zhang, et al., Physical Review B 90, 245311, Dec. 30, 2014.
"Ultrafast optical control of entanglement between two quantum-dot spins" D. Kim (HRL), et al. Nature Physics, vol. 7, pp. 223-229, Mar. 2011.
"Pulsed Nuclear Pumping and Spin Diffusion in a Single Charged Quantum Dot", T. D. Ladd (HRL) et al., Physical Review Letters 105, 107401, Sep. 3, 2010.

\* cited by examiner

ETCHED SPIN-QUBIT FOR HIGH TEMPERATURE OPERATION

CROSS REFERENCE TO RELATED APPLICATIONS

None.

STATEMENT REGARDING FEDERALLY SPONSORED RESEARCH OR DEVELOPMENT

None.

TECHNICAL FIELD

This invention relates to a type of qubit which operates via kinetic exchange of electron spins. Unlike existing exchange-based qubits, electron confinement is provided by etched semiconductor-to-vacuum and/or semiconductor-to-insulator interfaces.

BACKGROUND

The term qubit (or qbit) stands for "quantum bit" which is a unit of quantum data. It is the quantum analogue of the term 'bit' used in classical computer architectures. A qubit has two states: vertical polarization and horizontal polarization. But quantum computing is different from classical digital computing in that these the two states can exist as a superposition of these two states and thus a qubit can contain more information than a classical digital bit.

Qubits come in many forms, including both atomic approaches such as single, laser-cooled ionized atoms in RF traps and solid-state approaches such as superconductor or semiconductor-based systems. The latter have more promise for scalability by leveraging large-scale fabrication methods from modern microelectronics, but typically require cryogenic operation. Superconducting qubits require cryogenics to maintain superconductivity; for semiconductor qubits, the reasons for cold operation are more subtle. In fact, room temperature coherence has been demonstrated for some semiconductor qubits, including nuclei in silicon (see Saeedi, Kamyar et al., "Room-Temperature Quantum Bit Storage Exceeding 39 Minutes Using Ionized Donors in Silicon-28." *Science* 342 (6160) 2013), electrons and nuclei of defects in diamond (see M. V. G. Dutt et al., "Quantum Register Based on Individual Electronic and Nuclear Spin Qubits in Diamond," *Science* 316 (5829), 2007) or silicon carbide (W. F. Koehl et al., "Room temperature coherent control of defect spin qubits in silicon carbide," Nature 479, 84 (2011)) and other systems. The key challenge of all these systems is the relative isolation and random placement of these types of qubits; forming well controlled, scalable arrays of these qubit types is extremely challenging. Of semiconductor qubits, those that are most naturally suited for the fabrication of scalable, deliberately placed arrays are electrically defined quantum dots. For background material regarding such dots, see, for example, R. Hanson et al., "Spins in few-electron quantum dots," *Reviews of Modern Physics* 79, 1217 (2007). These use a combination of semiconductor interfaces and lithographically defined metal gates to trap electrons whose spins may be used as qubits. While these quantum dots more scalable from a fabrication point-of-view, electrically controlled quantum dot qubits operate at low temperature, typically beneath 1 K.

Quantum dots fully confine electrons in three dimensions. Typically, at least one dimension is confined by a semiconductor heterostructure or semiconductor-oxide interface, defined by epitaxy or deposition. The other two dimensions of confinement may then be provided by electrostatic gates or by other interfaces. For those dots using electrostatic gates, the rather weak confinement provided by the gates requires <1 K operation to avoid thermal excitation into low-lying orbital states. Fully semiconductor-defined dots such as self-assembled InAs quantum dots in GaAs are confined three dimensionally by the InAs-to-GaAs interface, and therefore have much larger confinement potentials and so may be operated at much higher temperatures (>10 K), but again these are difficult to scale into extensible arrays. Embodiments of the present invention relate to etched quantum dots, in which one or more of the confinement dimensions are provided by an etched semiconductor-to-vacuum interface (or semiconductor-to-insulator interface if encapsulated). Individual etched dots with high-temperature operation have been demonstrated as single-photon sources. See L. Zhang et al., "Charge-Tunable Indium Gallium Nitride Quantum Dots," *Physical Review B* 93(8), 085301 (2016). The present applications considers the extension of such single etched dots into arrays enabling a controllable exchange coupling exists from one dot to the next. This controllable exchange coupling enables "quantum coherent logic," as in more traditional exchange-based spin qubits.

In accordance with embodiments of the present invention, the essence of the controlled exchange coupling for etched dots is to define arrays of dots by a "nanopillar ridge." This nanopillar ridge is etched following atomic planes, for example the "m-planes" of Wurtzite GaN. The pillar sidewalls provide transverse electron confinement while a quantum well, for example implemented as InGaN in GaN or GaN in AlGaN, provides vertical confinement within each pillar of the "nanopillar ridge". The "nanopillar ridge" or simply "ridge" is not composed of isolated pillars or a smooth beam, but is preferably implemented in rather a corrugated pattern or structure in which transverse constrictions exist between neighboring dot locations in neighboring pillars. The size of those constrictions may be precisely controlled by etching the semiconductor materials and the size of those constrictions determines the rate of quantum tunneling from one Quantum Dot (QD) site in one pillar to the next QD site in the next (neighboring) pillar. To construct an array of qubits, quantum tunneling is combined with the detuning of the energy levels of dots via electrostatic metal gates at each dot site to establish voltage-controlled kinetic exchange. Qubit operation may be controlled via gate voltages, via laser-induced excitons in the the QDs (also sometimes called just 'dots' herein), or a combination thereof.

An important advantage of using etched interfaces for quantum dots is that they enable much higher temperature qubit operation relative to more traditional spin qubits. See R. Hanson, *Phys. Rev. Lett.* 91, 196802 (2003); J. R. Petta, et al. *Science* 309, 2180 (2005); H. Bluhm, et al. *Nature Phys.* 7, 109 (2011); M. D. Shulman, et al. *Science* 336, 202 (2012); M. D. Shulman, et al. *Nature Comm.* 5, 5156 (2014); B. M. Maune, et al. (HRL) *Nature* 481, 344 (2012); K. Eng, et al. (HRL) *Science Advances* 1, e1500214 (2015); and M. Veldhorst, et al. *Nature* 526, 410 (2015).

When surface etching defines quantum dots for spin qubits, the resulting dots may be very small (for "strongly confined" electrons) As a result, excited state energies are substantially higher than in more traditional exchange-based dots which use electrostatic gates for transverse confinement. In both etched and gated cases, a quantum well heterostructure provides strong vertical confinement. Excited state energies ultimately limit the temperature of operation, since high-fidelity qubit initialization depends on avoiding thermal excitation into excited states. As a comparison, traditional gated exchange-based spin qubits in the AlGaAs/GaAs (see the articles by R. Hanson, J. R. Petta, H. Bluhm, M. D. Shulman noted above), Si/SiO$_2$ (see the article by M. Veldhorst noted above), or Si/SiGe (see the articles by B. M. Maune and K. Eng noted above) systems require dilution refrigerator temperatures, typically less than 1 K, due to excited state energies occurring at less than 1 meV. Etched dots, in contrast, may have excited state energies in excess of 7 meV, which enables operation at 77 K, the temperature of liquid nitrogen. Device operation using liquid nitrogen cryogenics or closed-cycle helium cryostats operating above 4 K are substantially less expensive and more tolerant of heat load than dilution refrigerators, giving substantial engineering importance to this temperature difference.

So "high temperature" in the context of this invention, means a temperature greater than 4 K, which, of course, is very cold relative to room temperature.

Note that this same principle of strong confinement underlies the higher temperature operation of spin qubits based on semiconductor defects (see F. Dolde, et al., *Nature Phys.* 9, 139 (2013)) or self-assembled quantum dots (see B. Sun, et al. *Phys. Rev. Lett.* 108, 187401 (2012); C. Schneider, et al. *Nanotechnology* 20, 434012 (2009); D. Kim, et al., *Phys. Rev. Appl.*, 5, 024014 (2016)).

An advantage of etched dots relative to these other potentially high-temperature systems referenced in the preceding paragraph is that etched dots are fabricated on demand at prescribed locations, whereas self-assembly or defect implantation are random processes. The resulting random qubit placement of the prior art complicates fabrication and/or operation of arrays of qubits.

The notion that highly confined qubits allow higher temperature operation should be apparent to those skilled in this technology, but it is not obvious how to make existing highly confined qubits scalable to arrays larger than a few dots. The use of etched InGaN/GaN to make higher temperature single-spin qubits is known in the art (see L. Zhang, et al. *Appl. Phys. Lett.* 103, 192114 (2013) and L. Zhang, et al. *Phys. Rev. B* 93, 085301 (2016)), but the exchange coupling of multiple dots is not an obvious mode of operation. In the present invention, a novel geometry is disclosed which is based on etching to atomic planes of GaN crystal structure, which provides a controllable exchange coupling across an array of nanopillars. In most materials, the etched surface would destabilize the confined electron spins. In GaN, however, the low surface recombination velocity allows stable electrons close to the etched surfaces, making the presently disclosed techniques possible in a way unavailable to more traditional semiconductor systems such as Si or GaAs.

BRIEF DESCRIPTION OF THE INVENTION

In one aspect the present invention provides a device for storing and/or transferring quantum data, the device comprising: a plurality of elongate semiconductive structures arranged in side by said with each elongate semiconductive structure has a quantum well layer of one semiconductor material disposed between upper and lower layers of a different semiconductor material which share the same or essentially the same crystalline structure as that of the quantum well layer, neighboring ones of the elongate semiconductive structures sharing a region forming a constriction between said neighboring ones of the elongate semiconductive structures.

In another aspect the present invention provides a method of adjusting exchange coupling between laterally coupled quantum wells in a quantum device having sidewalls, the method including: defining the sidewalls by etching a crystalline structure along lattice planes of said crystalline structure, the crystalline structure, after the sidewalls are etched, having a corrugated shaped with protuberances and grooves on opposing major surfaces thereof, and controlling a ratio of the distances (i) between opposing grooves on the opposing major surfaces of the crystalline structure and (ii) between opposing protuberances on the opposing major surfaces of the crystalline structure. The crystalline structure is preferably a Wurtzite crystalline structure and the lattice planes are preferably m-planes of the Wurtzite crystalline structure. This ratio, which defines a width of a path for exchange coupling between said laterally coupled quantum wells, preferably falls between 0.25 and 0.75.

BRIEF DESCRIPTION OF THE DRAWINGS

FIG. 1-1 is an enlarged of a portion of FIG. 1 showing, for example, dot orbitals (identified by the more lightly shaded region around each dot 15) in greater detail.

FIG. 1-2 shows the Wurtzite crystalline structure of GaN, where the relatively larger atoms are Ga and the relatively smaller atoms are N and where two of the many m-planes are specifically identified by shading.

FIG. 2 shows the results of a simulation of the energy levels in a system such as the depicted by FIG. 1. The width l of each nanopillar 12 along the ridge is shown on the x-axis while the ridge width w is shown in the vertical axis.

DETAILED DESCRIPTION

Figure 1:
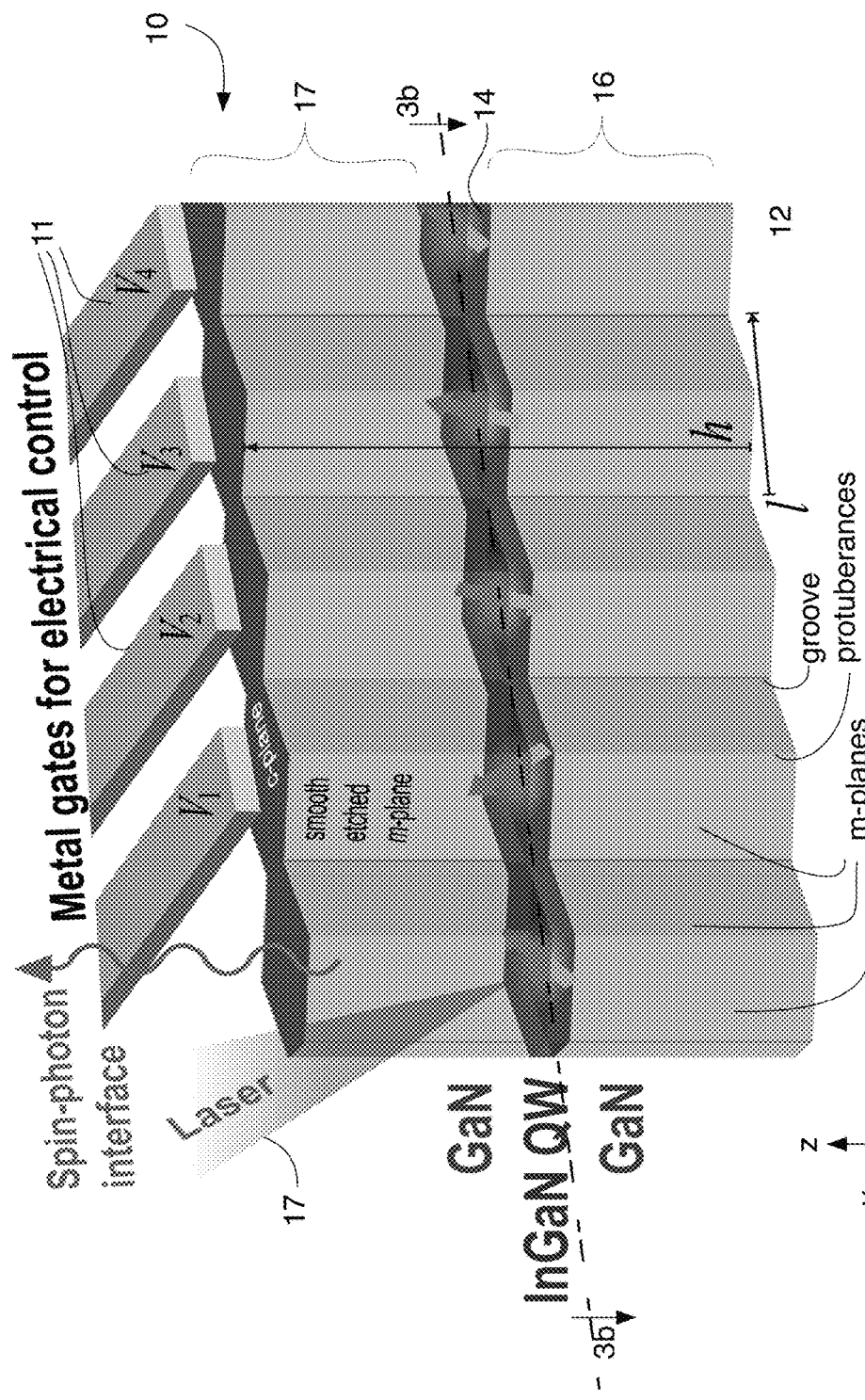
FIG. 1 depicts a linear array of five connected pillars, although there is no reason an array cannot feature far more than five. The major surfaces of the pillars are defined by the m-planes of the Wurtzite crystalline structure of GaN, each pillar having a Quantum Dot (QD) located in a Quantum Well (QW) layer, the QD being arranged essentially midway between a top surface and a bottom surface of each pillar and the QD being essentially centered in the QW layer of each pillar.
Figure 1:
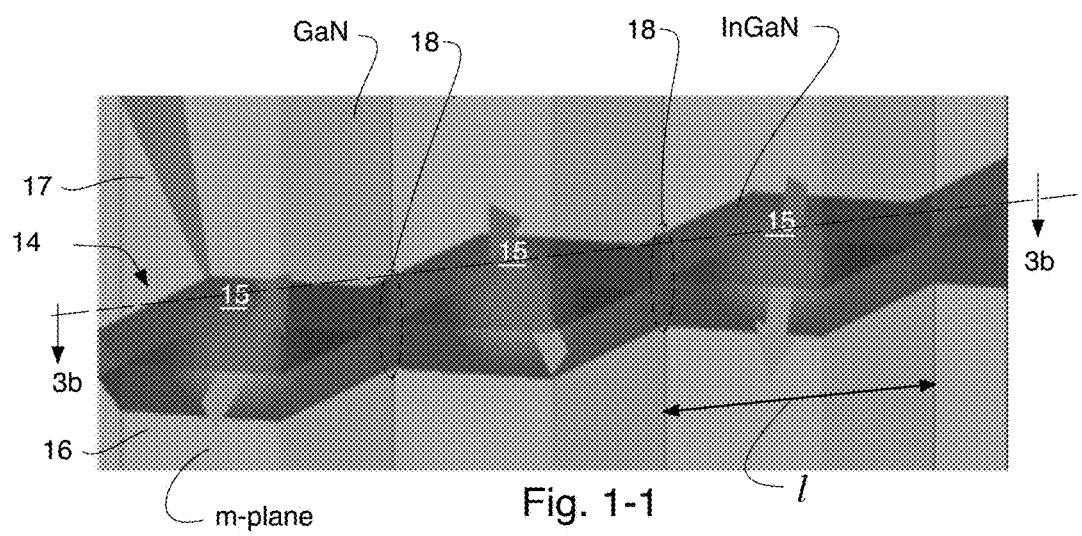

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112(f). In particular, the use of "step of" or "act of" in the claims herein is not intended to invoke the provisions of 35 U.S.C. 112(f).

The present invention relates a semiconductor structure and a method of fabrication of the semiconductor structure which enables spin qubits to operate at a substantially higher temperature than the millikelvin temperatures which occurs in the current state of the art.

The operating temperature of our proposed qubit may be 4 K to 10 K (essentially equivalent to liquid helium), 77 K (essentially equivalent to liquid nitrogen), or possibly even room temperature, depending primarily on fabrication capability. This increased temperature is enabled by very small quantum dots, which are fabricated in a GaN alloy heterostructure material system. The surface qualities and spin-orbit couplings of GaN favor the ability to define etched quantum dots with long spin relaxation times.

These dots may be arranged into extensible arrays (see FIG. 1) in which tight dot confinement is provided by etched surfaces, while chemical potential differences are defined by electrostatic gates. Characterization of this system may use a combination of laser induced excitons and electrical control of exchange interactions via the metal gates.

FIG. 1 depicts an array (ridge) of five pillars 12 which define an array of QDs 15 in a QW layer 14 thereof. The major surfaces of the pillars 12 are defined by the m-planes of the Wurtzite crystalline structure preferably formed of GaN, each pillar 12 having a Quantum Dot (QD) 15 in a Quantum Well (QW) layer 14, each QD 15 arranged essentially (and preferably) midway between a top surface and a bottom surface of each pillar 12 and the QD 15 being essentially centered in the QW layer 14 of each pillar 12. The QW layer 14 need not be disposed midway the top surface and the bottom surface of each pillar 12, but maximizing the distance of the QW from the top and bottom surfaces will reduce noise in the device, so disposing it midway is preferred for that reason. FIG. 1 shows only five pillars for ease of illustration, it being recognized that embodiments of the invention actually used are likely to have many more (hundreds, for example) pillars 12 preferably arranged in a straight row. As such, the ridge of pillars is called 'extensible' herein in realization of the fact. Only four complete pillars 12 are shown in FIG. 1, with the right-most pillar 12 being only partially depicted for ease of illustration.

Figures 1, 2:
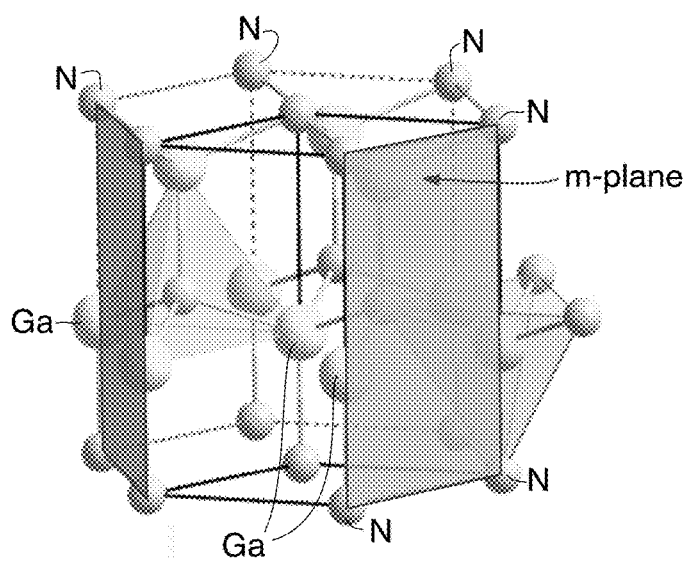
Figure 2:
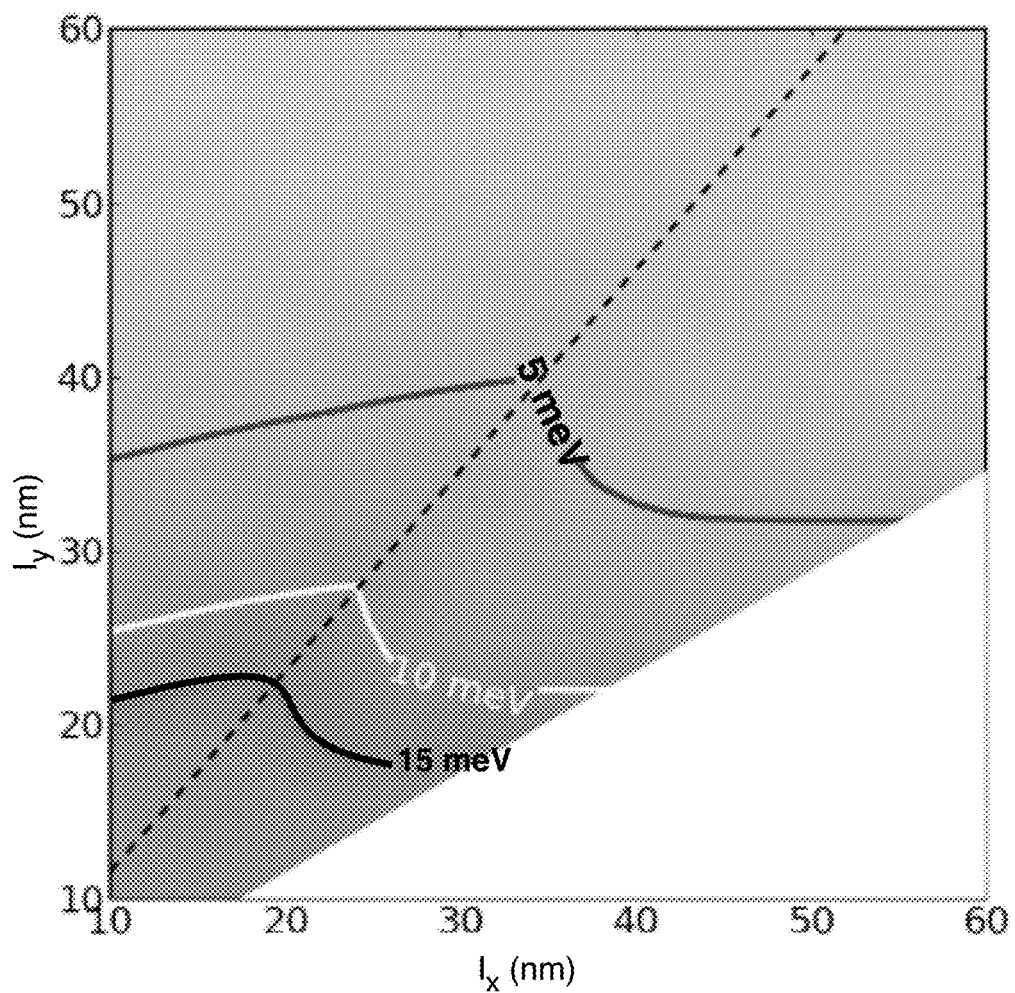

In FIG. 1, each pillar 12 has a quantum dot (QD) 15, which is depicted as a spot in the Quantum Well (QW) layer 14, each pillar 12 having with approximate lateral size or spacing l between 10 and 100 nm preferably equal to ~30 nm. The array of quantum dots are preferably defined via etching of a nanoridge 10 in the form of a linear array of pillars 12. The etching of the nanoridge 10 is described below with reference to FIGS. 5a-5e. The nanoridge 10, in this embodiment, preferably has a height h equal to ~100 nm, measured along the smoothly etched m-planes of a Wurtzite GaN crystal. FIG. 1 identifies the smoothly etched surfaces of the pillars 12 which are etched along the m-planes of the Wurtzite crystal structure of GaN. FIG. 1-2 shows the Wurtzite crystalline structure of GaN, where the relatively larger atoms are Ga and the relatively smaller atoms are N and where two of the many m-planes are specifically identified by shading. The shaded surfaces (m-planes) in FIG. 1-2 would appear as rectangles when viewed normally from planes with N (or Ga) atoms at their corners.

The pillars 12 are sometimes called nanopillars and the ridge 10 is sometimes called a nanoridge herein simply because these elements are quite small in order to provide electron confinement in the QD 15 in each pillar 12 as will be explained in greater detail below. The shape of the ridge 10 may be called corrugated in said much as the exposed m-planes in FIG. 1 define alternating protuberances and grooves.

The QW layer 14 is formed of a smaller-bandgap GaN alloy while the portions of the pillar on either side of the QW layer 14 are formed of layers 16 and 17 of a higher-bandgap GaN alloy. The lower bandgap alloy may be GaN in higher bandgap AlGaN alloy, or the lower bandgap alloy may be InGaN in higher-bandgap GaN. By "InGaN" we are referring to an $In_xGa_{1-x}N$ alloy with a value of x of between 0.01 and 0.5 and preferably equal to approximately 0.1 (10%), and likewise for AlGaN. These alloys also have a Wurtzite crystal structure with only slightly different crystal dimensions than GaN. $In_{0.1}Ga_{0.9}N$ has essentially the same crystalline structure has GaN has since the dilutant (In in this case) is mole-wise only about 10% of the group III material of the III-N (GaN in this case) material. Similarly, $Al_{0.1}Ga_{0.9}N$ has essentially the same crystalline structure has GaN has since the dilutant (Al in this case) is mole-wise only about 10% of the group III material of the III-N (GaN in this case) material.

Vertical confinement in a QD 15 occurs due to a lower-bandgap-alloy quantum well layer (see the QW 15 in FIG. 1). Doping the GaN alloys is not needed to achieve vertical confinement, but some practicing the present invention may choose to dope the GaN, InGaN and/or AlGaN layers with a semiconductor dopant. FIG. 1-1 is an enlarged of a portion of FIG. 1 to show, for example, dot orbitals (identified by the more lightly shaded region around each dot 15) in greater detail. Overlap and subsequent tunnel coupling is controlled in fabrication by narrowing the etched constriction 18 (in the region identified by broken lines depicted as an oval) between dots 15. The primary control mechanism for the array is detuning via metal top-gates 11, one per dot, but some dots 15 are preferably kept uncovered (see the left most pillar 12 in FIG. 1) for a laser-controlled spin-photon interface 17.

The primary control mechanism for the array is detuning via associated metal top-gates 11, approximately one per QD, but some QDs are kept transparent to visible light in order to allow a laser-controlled spin-photon interface instead. The laser-controlled spin-photon interface may be implemented in a variety of ways, but a probable method of control is using a combination of optical pumping via resonant lasers and virtual excitation of trion states, as has been performed in "Complete quantum control of a single quantum dot spin using ultrafast optical pulses," D. Press, T. D. Ladd, B. Zhang, and Y. Yamamoto, Nature 456, 218 (2008) and in many other demonstrations. It should be noted, however, that in the presently disclosed GaN alloy system, ultraviolet lasers would be required rather than infra-red as in this prior demonstration. Using this form of control, spins are initialized via optical pumping of a spectrally resolved Zeeman sublevel of a trion transition, and then spins are rotated via optical Stark shifts of trion transitions using polarized light. Data from other quantum devices may be loaded via teleportation with entangled states. Control of electron-electron entanglement in the array (for multi-qubit logic) is done via control of the kinetic exchange interaction, as performed in "Isotopically enhanced triple-quantum-dot qubit," K. Eng, et al. Science Advances 1, e1500214 (2015) and other demonstrations. This enables either the single spins loaded in dots or subspaces of multiple spins to undergo multiqubit quantum logic. Spin data may be read via singlet-triplet discrimination via charge sensing, as in the previously cited paper and many others; charge sensing via capacitive RF reflectometry of the metal gates is one possible way to achieve this. As a result of these control mechanisms, the device may be used as a modular component in a quantum computer, as a memory element in a quantum repeater capable of error correction, or for various other quantum information processing tasks.

The QDs 12 defined by the nanoridge 10 structure disclosed herein are very small in comparison to typical electrostatically defined semiconductor qubits. Very small quantum dots can be made in a variety of techniques, however many of these techniques (including the use of deep impurities) reduce the number of engineering degrees of freedom required for an extensible system. For example, strain-based self-assembly via Stranski-Krastanov or droplet epitaxy growth enables small InAs quantum dot qubits with spin-qubits operable beyond 10 K. Unfortunately, InAs dots show remarkable degradation in optical performance near the etched interfaces required for deterministic placement due to the surface properties of InAs and InGaAs. In contrast, the surface recombination velocity of GaN is two to three orders of magnitude slower than that of GaAs or InAs (see J. B. Schlager, et al. J. Appl. Phys. 103, 124309 (2008)), which has been shown to enable single InGaN/GaN quantum dots to be lithographically defined and etched and to perform as single photon sources at up to 90 K (see L. Zhang, et al. Appl. Phys. Lett. 103, 192114 (2013)). Spin qubits in these GaN-based dots have not yet been demonstrated, but deterministic single-electron charging of single quantum dots in site-controlled InGaN/GaN nanopillar dots in diode-like structures has been achieved (see L. Zhang, et al. Phys. Rev. B 93, 085301 (2016)). To achieve good sidewall behavior, the lithographic etching process used to create the dot array should result in sidewalls which follow the m-planes of the GaN Wurtzite crystal structure. This results in the compressed hexagonal geometry seen in FIGS. 1 and 3b, where four sides of the compressed hexagonal geometry of the pillars 12 (as seen in a top down view which would be similar to the sectional view of FIG. 3b) have the same lengths and are angularly defined by the m-planes of the GaN Wurtzite crystal structure and where the other two shorter sides of the compressed hexagonal geometry of pillar 12 usually abut the shorter sides of an immediately adjacent pillar 12.

The etched GaN dots 15 we consider here are of particular interest due to the possible scaling to extensible qubit arrays. The dots 15 are principally defined by their surface, but they include electrostatic gating using on each dot to control chemical potentials enabling tunable exchange interactions. Voltage tuning of exchange interactions is standard practice; see R. Hanson, Phys. Rev. Lett. 91, 196802 (2003); J. R. Petta, et al. Science 309, 2180 (2005); H. Bluhm, et al. Nature Phys. 7, 109 (2011); M. D. Shulman, et al. Science 336, 202 (2012); M. D. Shulman, et al. Nature Comm. 5, 5156 (2014); B. M. Maune, et al. (HRL) Nature 481, 344 (2012); K. Eng, et al. (HRL) Science Advances 1, e1500214 (2015); and M. Veldhorst, et al. Nature 526, 410 (2015).

FIG. 1 depicts an embodiment of the invention in which multiple dots 15 are defined via an etched ridge 10 etched along the smooth m-planes of the Wurtzite GaN crystalline structure, with tunnel barriers tuned by the degree of constriction at the dimension c (see FIG. 3b) between dots 15. This structure may be encapsulated in a dielectric (not shown) to assist in top-gating. A somewhat similar system is the silicon metal-oxide-semiconductor dots as developed at UNSW; these operate in a regime where very small dots and their tunnel barriers are primarily determined by the oxide interface, but sufficient detuning for controllable exchange is still available for multiqubit quantum logic (see M. Veldhorst, et al. Nature 526, 410 (2015)). Etched silicon nanowire qubit systems are also constructed with similar considerations (see Lavieville, et al., Nanoletters, 15, 2958 (2015), R. Maurand, et al. Nature Communications, 7, 13575, (2016), and M. Fernando Gonzalez-Zalba, Nanoletters 16, 1614 (2016)).

Spin relaxation is a critical factor for the implementation of spin qubits. Another reason prior implementations of spin qubits employ low-temperature operation concerns relaxation of spin states due to spin-orbit coupling and phonon scattering in the quantum dot. One may be concerned that spin relaxation in mesoscopic dots may become prohibitively short for materials with significant spin-orbit coupling. Single electron spin relaxation in very small GaN dots has not yet been measured in InGaN/GaN quantum dots, but long spin relaxation times are expected due to the substantially reduced spin-orbit coupling in GaN relative to GaAs. Spin relaxation times in bulk GaN systems comparable to GaAs at low-temperature have been measured, and unlike GaAs, these timescales persist to room temperature (see B. Beschoten, et al. Phys. Rev. B 63, 121202 (2001); J. H. Buß, et al. Phys. Rev. B 81, 155216 (2010); and A. Banerjee, et al. Nano Lett. 11, 5396 (2011)).

Also, it is well-known (and confirmed in GaAs) that spin-orbit interactions are far less effective for spin relaxation in small dots than in bulk (see A. V. Khaetskii and Y. V. Nazarov, Phys. Rev. B 64, 125316 (2001)). III-V semiconductors such as InAs/GaAs also have the well-understood challenge of nuclear hyperfine dephasing. For gated III-V quantum dots, dynamical decoupling (see H. Bluhm, et al. Nature Phys. 7, 109 (2011)) and methods employing hyperfine measurement and feedback (see M. D. Shulman, et al. Nature Comm. 5, 5156 (2014)) have brought dephasing times into the range of 100s of µsec, which is sufficient for quantum information processing tasks employing rapid exchange couplings (with order nanosecond gate time) and quantum error correction (QEC).

FIG. 2 shows the result of a simulation of the energy levels in a system of two quantum dots in an InGaN/GaN nanoridge 10 as illustrated in FIG. 1. The width 1 of each nanopillar 12 along the ridge 10 is shown on the x-axis while the ridge width w is shown in the vertical axis. In attachment A, color is used to encode the ground-to-excited state energy differences, with contours at 5 (blue), 10 (white) and 15 meV (red). This energy provides a loose upper bound of the device operating temperature. The corresponding thermal energies for these contours are 58, 116, and 174 K. The primary conclusion from this plot is that devices with spatial scale on the order of 30 nm may support temperatures as high as 77 K. Note that the dashed line corresponds to devices based on regular hexagons, at which point an energy degeneracy due to the increased symmetry provides the "kink" in the energy contours.

Figures 3A, 3B:
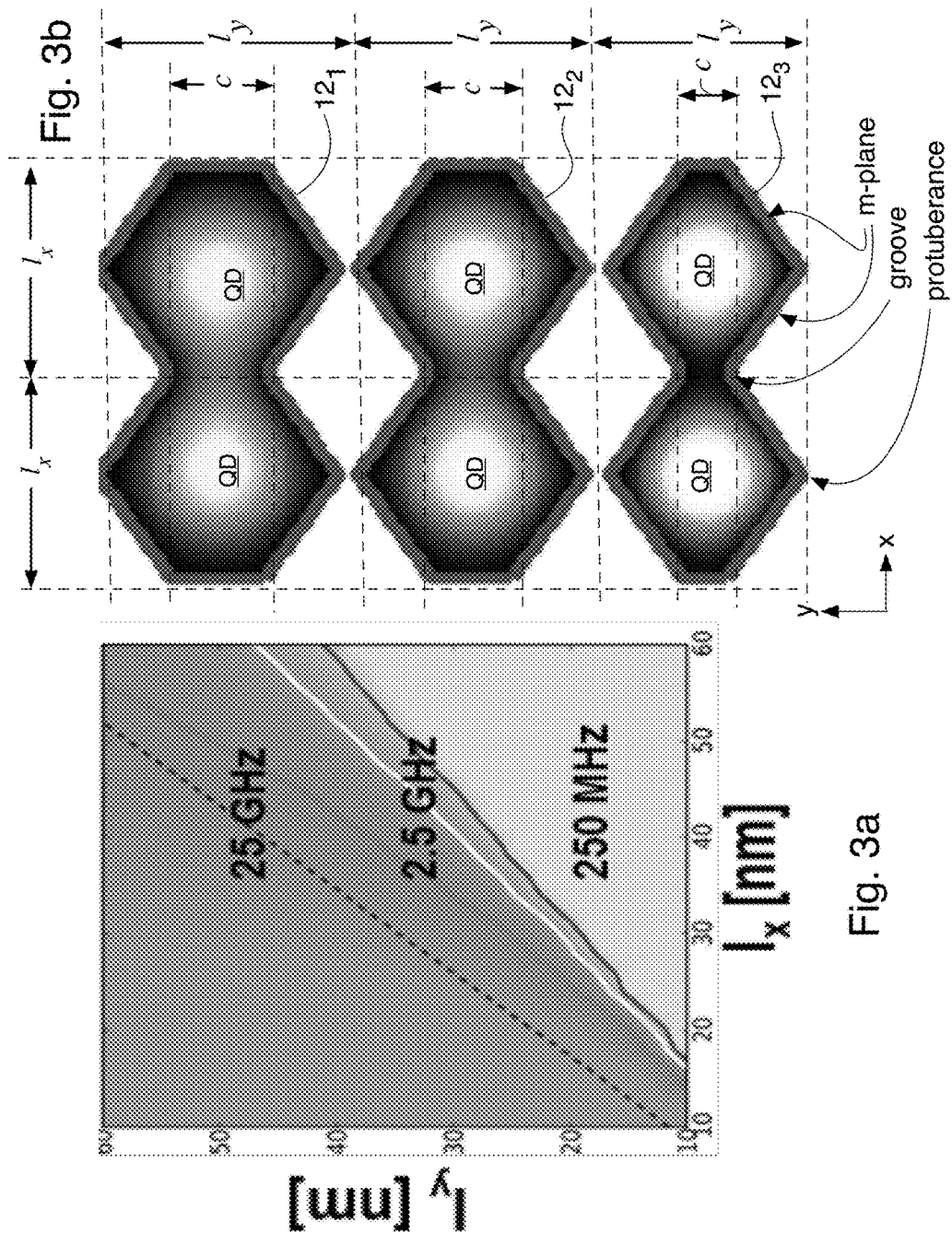
FIG. 3a shows the result of simulation of tunnel coupling rates in a system of two quantum dots in a GaN quantum well nanoridge as illustrated in FIGS. 1, 1-1 and FIG. 3b.
FIG. 3b is a top view of the Quantum Well (QW) layer taken along section lines 3b-3b shown in FIGS. 1 and 1-1.

FIG. 3a shows the result of simulation of tunnel rates. This figure shows the result of a simulation of the energy levels in a system of two quantum dots in an InGaN/GaN nanoridge 10 as illustrated in FIGS. 1, 1-1 and FIG. 3b (a top view of the QW layer 14 taken along section lines 3b-3b shown in FIGS. 1 and 1-1), and then the extraction of tunnel rates via the splitting between different charge states (see R. Hanson et al., "Spins in few-electron quantum dots," Reviews of Modern Physics 79, 1217 (2007) for terminology). The width $l_x$ of each nanopillar 12 along the ridge is shown on the x-axis while the ridge depth $l_y$ is shown along the y-axis of the graph of FIG. 3a. The shades of gray color reflect the interdot tunnel-rate, with contours at 0.25, 2.5, and 25 GHz being identified. See Appendix A where this data is represented by colors. This energy provides a loose upper bound of the potential qubit operation speed. The tunnel rate is affected by the dimension due to the changing size of the constriction c between the two dots. The size of the constriction c is constrained by the hexagonal geometry, and so by the width and depth axes as indicated by this figure. The ratio c::y preferably falls in the range of 0.25 to 0.75. Reasonable ranges of $(l_x/l_y)$ are shown via FIG. 2.

Three illustrative examples corresponding to three locations of this plot, with an indication of the simulated wavefunction density as represented by levels of gray in FIG. 3b.

An advantage of this disclosed technology is the higher operating temperature of the resulting device. This is supported by the simulation illustrated by FIG. 2, which shows the excited state energy of a simulated single quantum dot as a function of the device dimension. A further indication of the merit of this invention is the controllable tunnel rate between quantum dots. A calculation of this tunnel rate as a function of device dimension is shown in FIG. 3a. The main conclusions of these two calculations is that the proposed device geometry realistically supports fast exchange-qubit operation at reasonably high temperatures, while other experiments (see L. Zhang, et al. Appl. Phys. Lett. 103, 192114 (2013) and] L. Zhang, et al. Phys. Rev. B 93, 085301 (2016)) indicate sufficient material surface properties of InGaN/GaN to coherent quantum states, at least of excitons.

Figure 4:
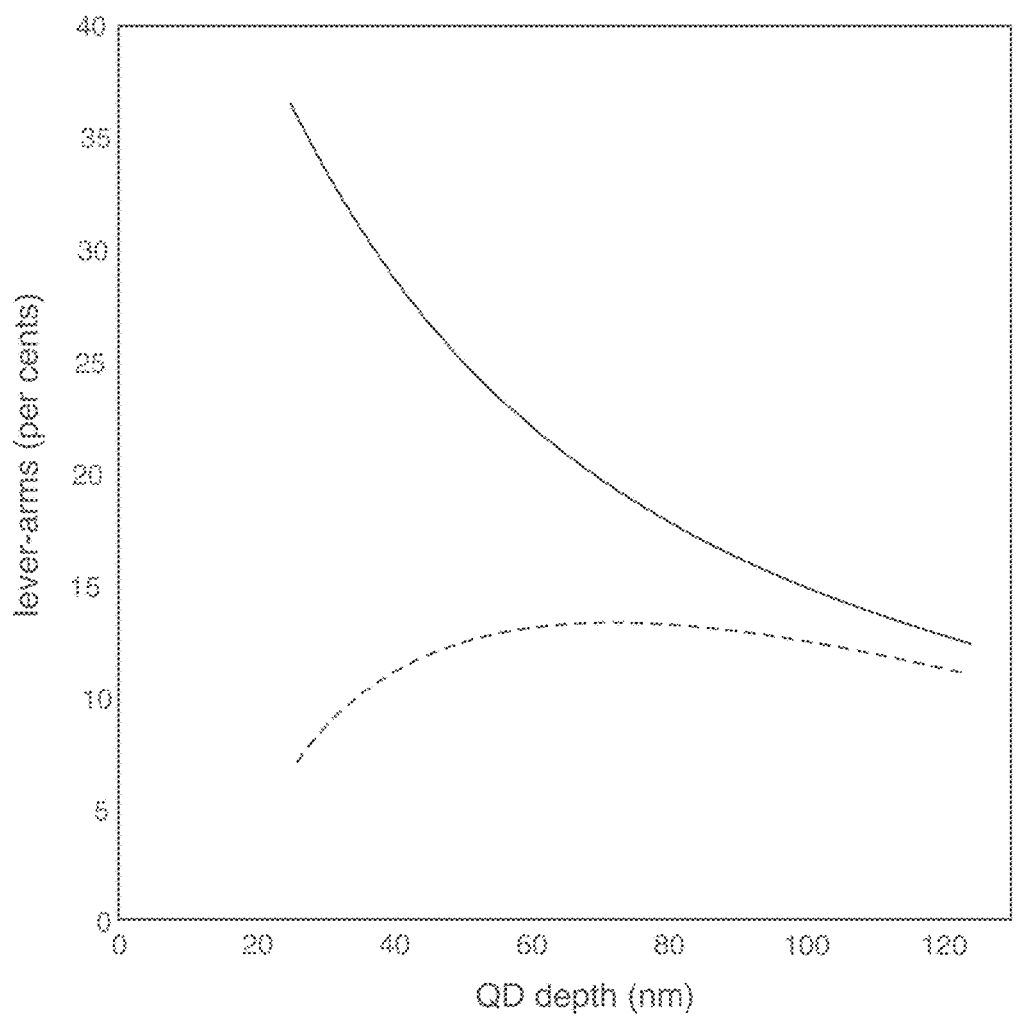
FIG. 4 shows the result of a simulation of the lever arms in a system of two quantum dots in a GaN quantum well nanoridge as illustrated by the structure depicted in FIG. 1.

FIG. 4 shows the result of a simulation of the lever arms in a system of two quantum dots in an InGaN/GaN nanoridge 10 as illustrated by the structure depicted in FIG. 1. The horizontal in this figure indicates depth of the InGaN quantum well relative to the top surface, while the vertical axis indicates the proportional energy shift per qubit relative to the voltage applied to the associated top gate 11. The solid line curve indicates the lever arm between a dot and the gate 11 immediately above it while the dashed line curve indicates the lever arm between a dot and the gate on the next dot over. The fact that the solid line curve is a substantial fraction and substantially higher than the dashed line curve at a QD depth of 50 nm indicates that this is a reasonable design parameter. Note that smaller depths would appear to be better based on this plot, but as the QD depth is reduced, noise due to the c-plane top surface (see FIG. 1) is likely to worsen, an effect not indicated by this figure.

A final consideration is demonstrated by FIG. 4, which shows the "lever arms" of the QDs 15. Lever arms indicate the ratio of the ground state energy (or "chemical potential") of an electron in each QD 15 to the energy of electrostatic potential created by top gates 11 (i.e. the voltage applied multiplied by the single electron charge). A lever arm of one would mean that a applying a gate voltage of 1 mV changes the quantum dot energy by one meV. Typically lever arms are substantially less than 1. In particular, FIG. 4 shows is that lever arms are substantially large (so large voltage drives are not required for the ~mV scale operation needed for control), and that for quantum dots approximately 50 nanometers from the surface, gates 11 primarily affect the energy of the dot they are attached and less so neighboring QDs, so that relative energy differences between QDs may be manipulated by applying voltages to the gates 11 depicted by FIG. 1. The resulting charge and spin dynamics of the electrons as a result of this manipulation, and ways to form quantum logic including initialization and measurement from those dynamics, are discussed in, for example, the review by R. Hanson and coworkers, as well as the other papers on semiconductor qubit implementation cited above.

Figure 5A:
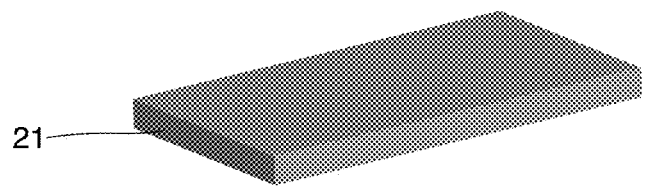
FIGS. 5a-5e depict process steps which may be utilized to form the structure depicted by FIG. 1.
Figure 5B:
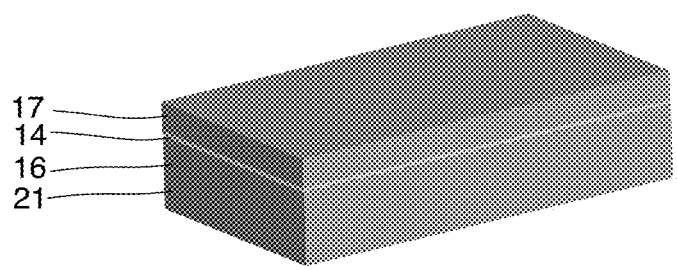

FIGS. 5a-5e depict one possible way of fabricating the nanoridge 10 structure depicted by FIG. 1. Additional process steps for fabricating top-gates is not shown for ease of illustration and explanation, but such steps would follow standard semiconductor structure gating processes in semiconductor microfabrication and therefor are omitted here to focus on more novel features.) The fabrication of the nanoridge 10 begins (see FIG. 5a) with a substrate 21 of GaN (or GaN on Sapphire). Then layers of GaN 16, InGaN (the QW layer) 14 and GaN 17 are deposited as is depicted by FIG. 5b.

Figure 5C:
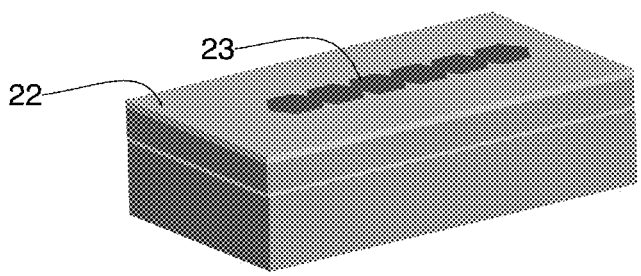
Figure 5D:
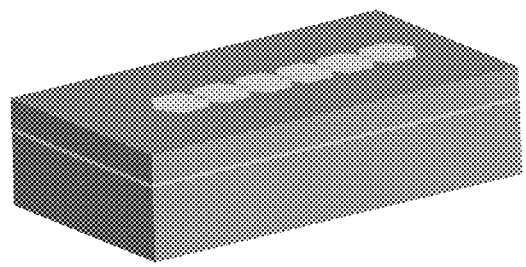
Figure 5E:
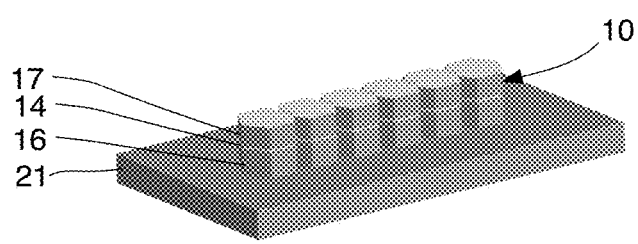

The structure depicted by FIG. 5b is then covered with a resist 22 and the resist 22 is patterned, preferably using standard semiconductor fabrication techniques, to form an opening 23 which is in the shape of the top of the nanoridge 10 as depicted by FIG. 1-1 or 3b. See FIG. 5c. In FIG. 5c the opening 23 is sized for six pillars 12 (see FIG. 1) in a linear array of same. In actual embodiments used in practice, the 23 might well accommodate hundreds (or even thousands) of pillars.

A layer of metal is laid down on the resist and through the opening 23 and on the exposed top of the upper GaN layer 17. The resist is dissolved, lifting off the metal thereon, leaving metal 24 in the shape of opening 23. See FIG. 5d.

Next the pillars are defined by etching along their m-planes. See FIG. 5e. The m-planes are vertically disposed as shown by the figures. The chemical etching process naturally exposes the m-planes since they are crystal facets (lattice planes) of the Wurtzite GaN crystalline structure.

In the foregoing description, the pillars have an upper layer 17 of GaN and a lower layer 16 of GaN with a layer of InGaN (the QW layer) 14 sandwiched in between them. But as has been noted above, GaN may alternatively be used for the QW layer 14 if AlGaN is used for the upper and lower layers 17 and 16.

The basic concept disclosed herein where a plurality of pillars 12 or other elongate semiconductive structures are arranged in side by said with each of pillar 12 or other elongate semiconductive structure having a QW layer 14 of one semiconductor material disposed between upper and lower layers 17 and 16 of a different semiconductor material which share the same or essentially the same crystalline structure as that of the QW layer 14, is usable as a QW memory or other device by arranging the neighboring (or side by side) pillars 12 or other elongate semiconductive structures so that they share a common constriction 18 where the pillars 12 or other elongate semiconductive structures contact a neighboring pillar 12 or other elongate semiconductive structure. Depending on the angles of the facets (lattice planes) of the crystalline structure of the semiconductor materials utilized, an array of pillars 12 or other elongate semiconductive structures may not necessarily be linear. Using the materials suggested herein results in a Wurtzite crystalline structure which conveniently allows the array of pillars 12 to be a linear array.

This concludes the description of embodiments of the present invention. The foregoing description of these embodiments and the methods of making same has been presented for the purposes of illustration and description. It is not intended to be exhaustive or to limit the invention to the precise form or methods disclosed. Many modifications and variations are possible in light of the above teachings. It is intended that the scope of the invention be limited not by this detailed description, but rather by the claims appended hereto.

What is claimed is:

1. A device for storing and/or transferring quantum data, the device comprising:
    a plurality of elongate semiconductive structures arranged in side by said with each elongate semiconductive structure having a quantum well layer of one semiconductor material disposed between upper and lower layers of a different semiconductor material which share the same or essentially the same crystalline structure as that of the quantum well layer,
    neighboring ones of the elongate semiconductive structures sharing a region forming a constriction between said neighboring ones of the elongate semiconductive structures.

2. The device claim 1 further including electrostatic gate structures formed on at least a portion of at least one of said upper and lower layers of the different semiconductor material for manipulating the electrostatic potential in a quantum well in said quantum well layer.

3. The device of claim 1 wherein the crystalline structure has six side walls.

4. The device of claim 1 wherein the crystalline structure is a Wurtzite crystalline structure.

5. The device of claim 4 wherein said quantum well layer and the upper and lower layers are selected from the group consisting of GaN, InGaN and AlGaN.

6. The device of claim 4 wherein said quantum well layer comprises InGaN and wherein the upper and lower layers comprise GaN.

7. The device of claim 4 wherein said quantum well layer comprises GaN and wherein the upper and lower layers comprise AlGaN.

8. The device of claim 4 wherein the shapes of the elongate semiconductive structures are defined by hexagonal or six sided pillars, the hexagonal or six sided pillars each having six planes defined by m-planes of said Wurtzite crystalline structure.

9. The device of claim 8 wherein four of said six planes are of substantially equal width and wherein the remaining two of said six planes are each of a lesser width than the substantially equal widths of said four of said six planes.

10. The device of claim 9 wherein neighboring pillars are formed integrally with each other at the planes of substantially lesser width of each neighboring pillar in order to define a constriction between neighboring pillars.

11. The device of claim 10 wherein neighboring pillars are spaced center-to-center by a distance between 10 nm and 100 nm, and preferably by a distance of about 30 nm.

12. The device of claim 11 wherein the quantum well layer in each pillar has a height or thickness between 1 and 20 nm and preferably a height or thickness of about 10 nm.

13. The device of claim 11 wherein the pillars each have a height of between 50 nm and 500 nm and preferably a height of about 100 nm.

14. The device of claim 1 wherein a plurality of elongate semiconductive structures arranged in side by side form a corrugated structure having an integral quantum well layer formed by the quantum well layers of the elongate semiconductive structures, said corrugated structure having sidewalls disposed at angles corresponding to lattice planes of said crystalline structure.

15. The device of claim 14 wherein the integral quantum well layer, in use, at least temporally confines a plurality of electrons, each of the temporally confined electrons residing at least temporally in one of a plurality of quantum wells defined in said integral quantum well layer.

16. The device of claim 14 wherein said crystalline structure is a Wurtzite crystalline structure and wherein the sidewalls of said corrugated structure are disposed an angle corresponding to m-planes of said Wurtzite crystalline structure.

17. An apparatus for adjusting exchange coupling between laterally coupled quantum wells in a quantum device having sidewalls, the apparatus including:
    sidewalls defined along lattice planes of a crystalline structure, the crystalline structure, after the sidewalls are defined, has a corrugated shape with protuberances and grooves on opposing major surfaces thereof, and
    wherein a ratio of distances (i) between opposing grooves on the opposing major surfaces of the crystalline structure and (ii) between opposing protuberances on the opposing major surfaces of the crystalline structure is predetermined.

18. The apparatus of claim 17 wherein said crystalline structure is a Wurtzite crystalline structure and wherein said lattice planes are m-plane of the Wurtzite crystalline structure.

19. The apparatus of claim 18 wherein said ratio defines a width of a path for exchange coupling between said laterally coupled quantum wells.

20. The apparatus of claim 18 wherein said ratio is between 0.25 and 0.75.

* * * * *